United States Patent
Watatani et al.

(10) Patent No.: US 7,855,096 B2
(45) Date of Patent: Dec. 21, 2010

(54) METHOD FOR MANUFACTURING SEMICONDUCTOR DEVICE

(75) Inventors: Chikara Watatani, Tokyo (JP); Toru Takiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 144 days.

(21) Appl. No.: 12/034,195

(22) Filed: Feb. 20, 2008

(65) Prior Publication Data

US 2009/0087966 A1 Apr. 2, 2009

(30) Foreign Application Priority Data

Sep. 28, 2007 (JP) ............... 2007-253303

(51) Int. Cl.
H01L 21/00 (2006.01)
(52) U.S. Cl. ................... 438/93; 438/164; 257/E21.086
(58) Field of Classification Search ................ 438/164, 438/46, 93, 494; 257/200, 201
See application file for complete search history.

(56) References Cited

U.S. PATENT DOCUMENTS

| 5,400,740 | A | | 3/1995 | Goto et al. |
| 5,622,559 | A | | 4/1997 | Goto et al. |
| 5,770,471 | A | * | 6/1998 | Nagai ................... 438/31 |
| 5,864,161 | A | | 1/1999 | Mitani et al. |
| 6,342,421 | B1 | | 1/2002 | Mitani et al. |
| 2006/0105505 | A1 | * | 5/2006 | Behammer ............... 438/142 |

FOREIGN PATENT DOCUMENTS

| JP | 5-175150 A | 7/1993 |
| JP | 5-226362 A | 9/1993 |
| JP | 5-335241 A | 12/1993 |
| JP | 8-78335 A | 3/1996 |
| JP | 8-107144 A | 4/1996 |
| JP | 8-153688 A | 6/1996 |
| JP | 9-82798 A | 3/1997 |
| JP | 9-92621 A | 4/1997 |
| JP | 9-320964 A | 12/1997 |
| JP | 11-274645 A | 10/1999 |
| JP | 2006-135340 A | 5/2006 |

OTHER PUBLICATIONS

Tsuji, M. et al.; "Selective growth of InAlAs by low pressure metalorganic vapor phase epitaxy", J. of Crystal Growth, 162, pp. 25-30, (1996).
Shimoyama, K. et al.; "Novel selective area growth of AlGaAs and AlAs with HCl gas by MOVPE", J. of Crystal Growth, 124, pp. 235-242, (1992).

* cited by examiner

Primary Examiner—Chuong A Luu
Assistant Examiner—Nga Doan
(74) Attorney, Agent, or Firm—Leydig, Voit & Mayer, Ltd.

(57) ABSTRACT

A semiconductor film is formed on a GaAs substrate (semiconductor substrate). An $SiO_2$ film (insulating film) is formed on the semiconductor film, and the $SiO_2$ film is patterned. The semiconductor film is etched using the $SiO_2$ film as a mask to form a mesa structure. The surface of the $SiO_2$ film is treated by ashing, using $SF_6$ gas (fluorine-containing gas), to terminate the surface of the $SiO_2$ film with fluorine. The mesa structure is selectively buried with a III-V compound semiconductor film, using the $SiO_2$ film having the surface that has been terminated by fluorine, as a mask.

11 Claims, 7 Drawing Sheets

— before ashing treatment using SF6 gas
— after ashing treatment using SF6 gas

METHOD FOR MANUFACTURING SEMICONDUCTOR DEVICE

BACKGROUND OF THE INVENTION

1. Field of the Invention

The present invention relates to a method for manufacturing a semiconductor device enabling favorable burying growth and selection growth without growing a group III-V compound semiconductor film on an insulating film used as a mask.

2. Background Art

In semiconductor devices such as semiconductor laser elements and modulators, a mesa structure is often formed to limit the range of a current supply region for efficiently confining light or electric current in an active layer. In this case, from a viewpoint of the improvement of heat dissipation, the reduction of electrical capacity, or the protection of the mesa shape, a buried mesa structure wherein a mesa structure is selectively buried in a semiconductor film is often adopted.

In a process for manufacturing such a buried semiconductor device, a semiconductor film is etched using a patterned insulating film as a mask to form a mesa structure, and the mesa structure is buried in the semiconductor film using the insulating film as a mask for burying.

However, if a mesa structure is buried in a group III-V compound semiconductor film, crystals are grown on the insulating film depending on growing conditions, and a subsequent step for removing the insulating film is interfered. Particularly when an Al-containing semiconductor material such as AlInAs and AlInP, is used for the group III-V compound semiconductor film, the growth of crystals on the insulating film is significant. Also when a group III-V compound semiconductor film is selectively formed on a semiconductor substrate using a patterned insulating film as a mask, the similar problem is caused.

Heretofore, by the adjustment of growing temperature (for example, refer to "Selective Growth of InAlAs by Low Pressure Metalorganic Vapor Phase Epitaxy", M. Tsuji, K. Makita, T. Takeuchi, K. Taguchi, Journal of Crystal Growth, 162 (1996), p. 25), or the introduction of a gas having an etching effect together with a semiconductor material gas into a reactor during crystal growing (for example, refer to "Novel Selective Area Growth of AlGaAs and AlAs with HCl Gas by MOVPE", K. Shimoyama, Y. Inoue, K. Fujii, H. Gotoh, Journal of Crystal Growth, 124 (1992), p. 235), the growth of the group III-V compound semiconductor film on the insulating film has been prevented.

SUMMARY OF THE INVENTION

However, since growing conditions are limited in conventional methods, there were cases wherein the growing conditions were not suited for burying growth or selection growth of group III-V compound semiconductor films, or wherein the growing conditions became complicated. Therefore, there was a problem wherein favorable burying growth or selection growth could not be achieved.

To solve the above-described problems, an object of the present invention is to provide a method for manufacturing a semiconductor device enabling favorable burying growth and selection growth without growing a group III-V compound semiconductor film on an insulating film used as a mask.

According to one aspect of the present invention, a method for manufacturing a semiconductor device comprises the steps of: forming a semiconductor film on a semiconductor substrate; forming an insulating film on said semiconductor film and patterning said insulating film; etching said semiconductor film using said insulating film as a mask to form a mesa structure; terminating the surface of said insulating film using fluorine; and selectively burying said mesa structure in a group III-V compound semiconductor film using said insulating film whose surface has been terminated using fluorine as a mask.

According to the present invention, favorable burying growth and selection growth can be achieved without growing a group III-V compound semiconductor film on an insulating film used as a mask.

Other and further objects, features and advantages of the invention will appear more fully from the following description.

DETAILED DESCRIPTION OF THE PREFERRED EMBODIMENTS

First Embodiment

Figure 1:
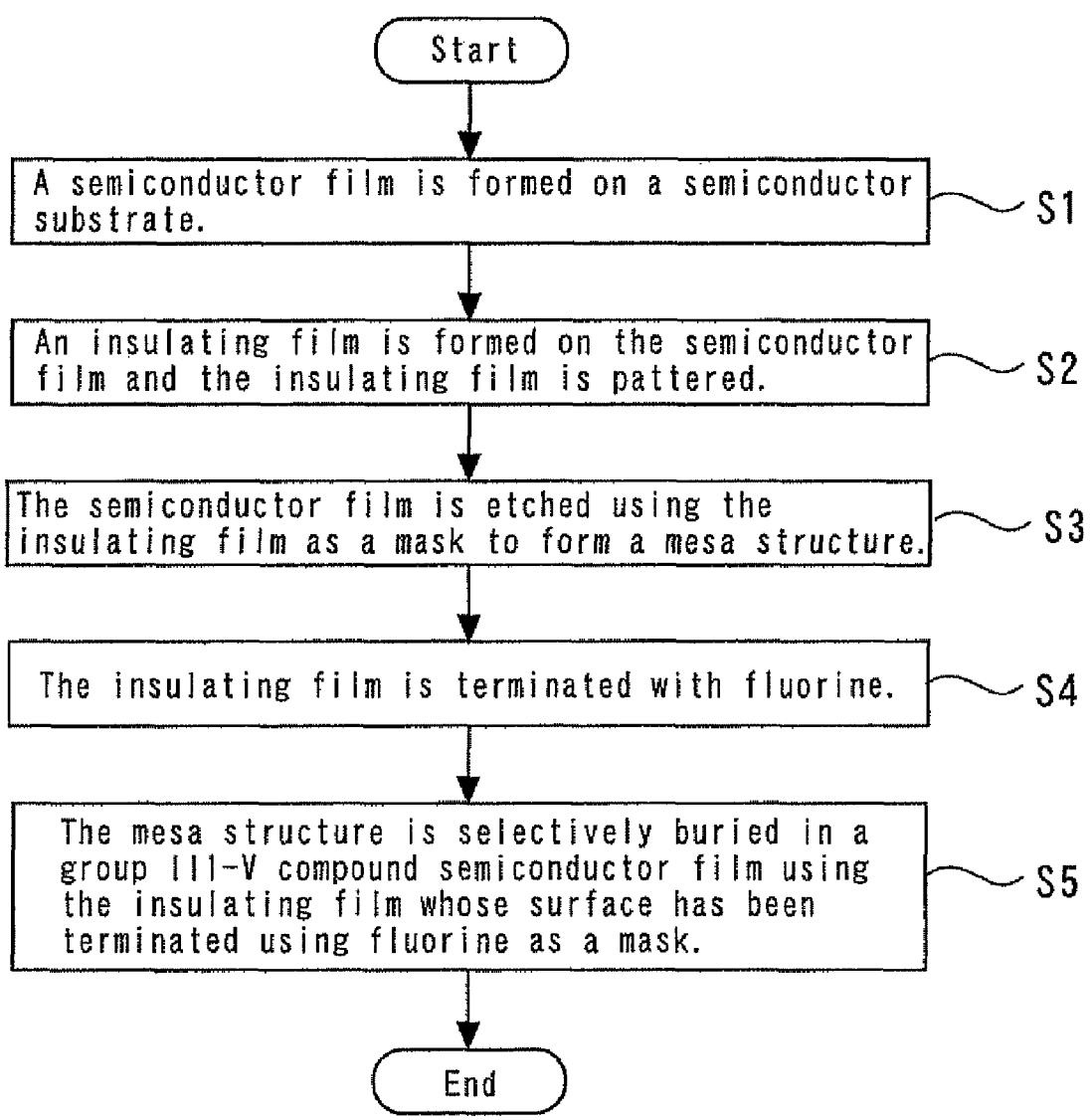
FIG. 1 is a flow chart for explaining a method of manufacturing a semiconductor device according to First Embodiment of the present invention.

A method for manufacturing a buried semiconductor laser element (semiconductor device) according to the first embodiment of the present invention will be described referring to a flow chart shown in FIG. 1.

Figure 2:
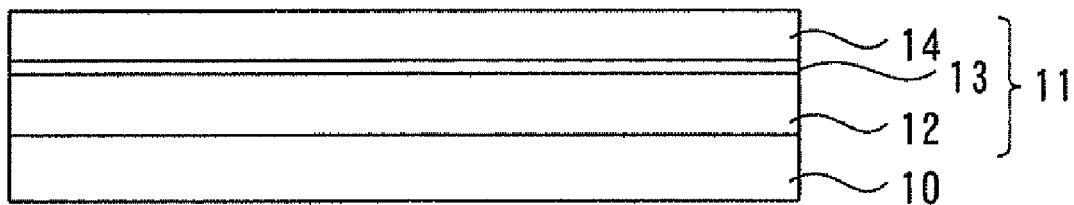
FIGS. 2-5, 7 are sectional views for explaining a method of manufacturing a semiconductor device according to First Embodiment of the present invention.

First, as shown in FIG. 2, as a semiconductor film 11, a p-type lower clad layer 12, undoped MQW (multiple quantum well) active layer 13, and an n-type upper clad layer 14 are formed on a p-type GaAs substrate 10 (semiconductor substrate) using MOVPE (metal organic vapor phase epitaxy) (step SI).

Figure 3:
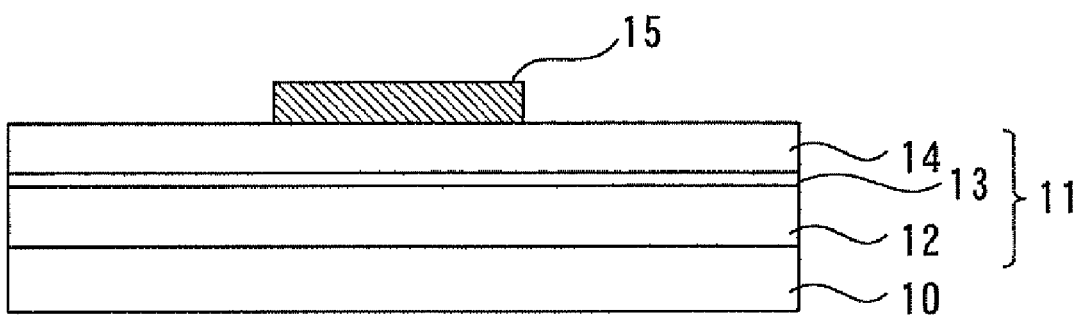
Figure 4:
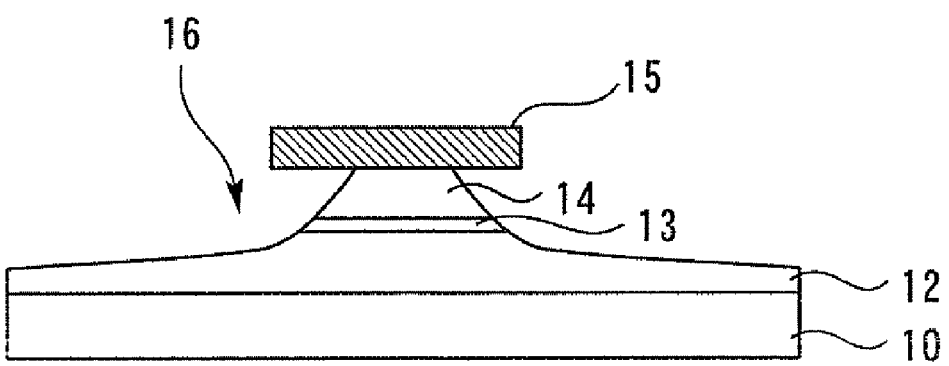

Next, as shown in FIG. 3, an $SiO_2$ film 15 (insulating film) is formed on the semiconductor film 11, and the $SiO_2$ film 15 is patterned using photoengraving (step S2), Next, as shown in FIG. 4, the semiconductor film 11 is subjected to wet etching using the patterned $SiO_2$ film 15 as a mask to form a mesa structure 16 (step S3).

Figure 5:
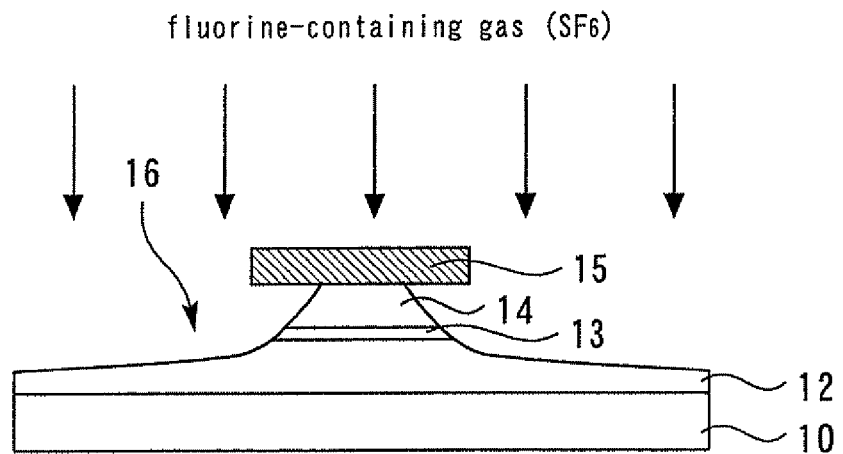
Figure 6:
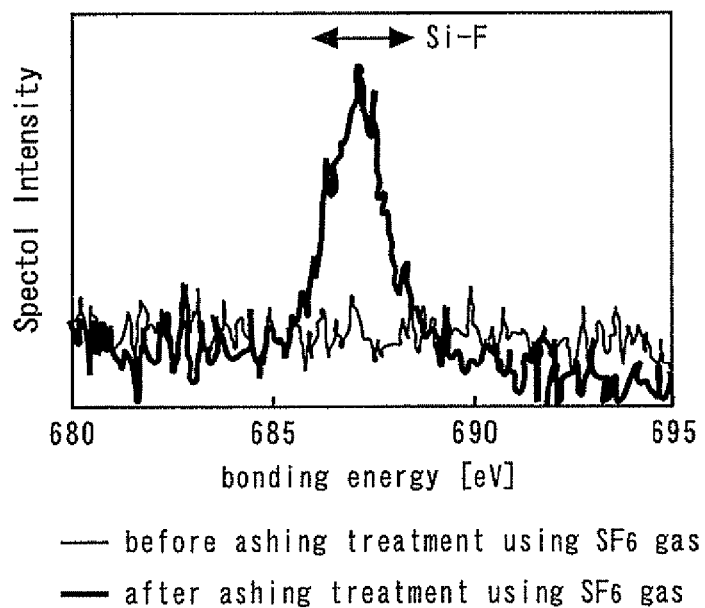
FIG. 6 is a graph showing the results of XPS (X-ray photoelectron spectroscopy) analyses for the surface of the $SiO_2$ film before and after ashing treatment using $SF_6$ gas.

Next, as shown in FIG. 5, the surface of the $SiO_2$ film 15 is treated by ashing using $SF_6$ gas (fluorine-containing gas) to terminate the surface of the $SiO_2$ film 15 (step S4). FIG. 6 is a graph showing the results of XPS (X-ray photoelectron spectroscopy) analyses for the surface of the SiO₂ film before and after ashing treatment using SF₆ gas. A peak caused by Si—F bonding is observed on the surface of the SiO₂ film treated by ashing, and termination by fluorine can be known.

Figure 7:
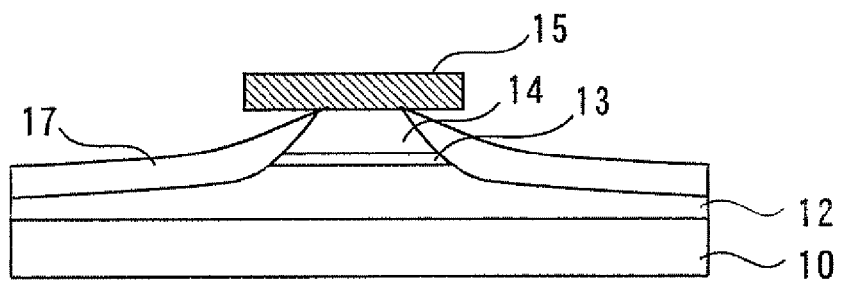

Next, as shown in FIG. 7, using MOVPE, the mesa structure 16 is selectively buried with the group III-V compound semiconductor film 17 using the SiO₂ film 15 whose surface has been terminated with fluorine as a mask (step S5). Thereafter, through other generally-used process steps, a semiconductor laser element can be manufactured.

Figure 8:
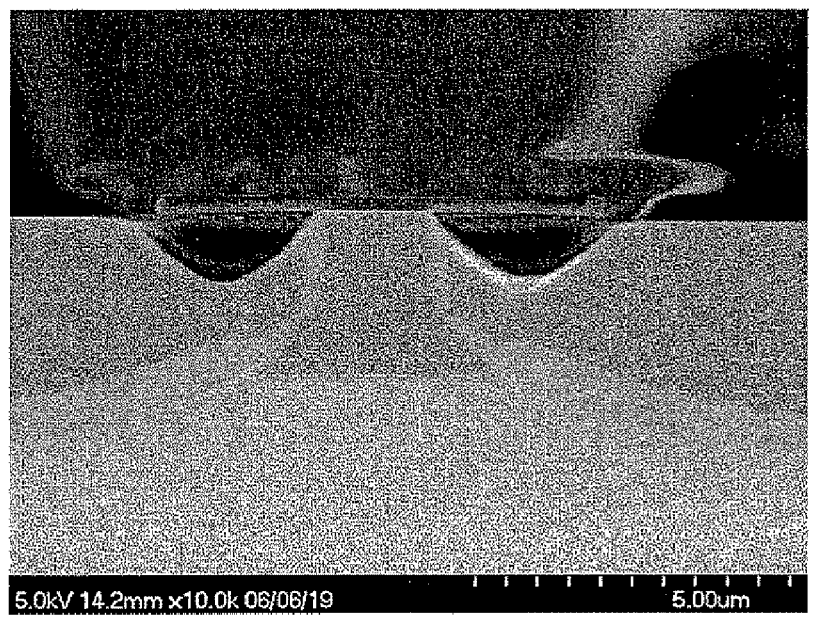
FIG. 8 is a cross-sectional SEM (scanning electron microscope) image after performing mesa burying growth when ashing treatment has been performed using $SF_6$ gas.
Figure 9:
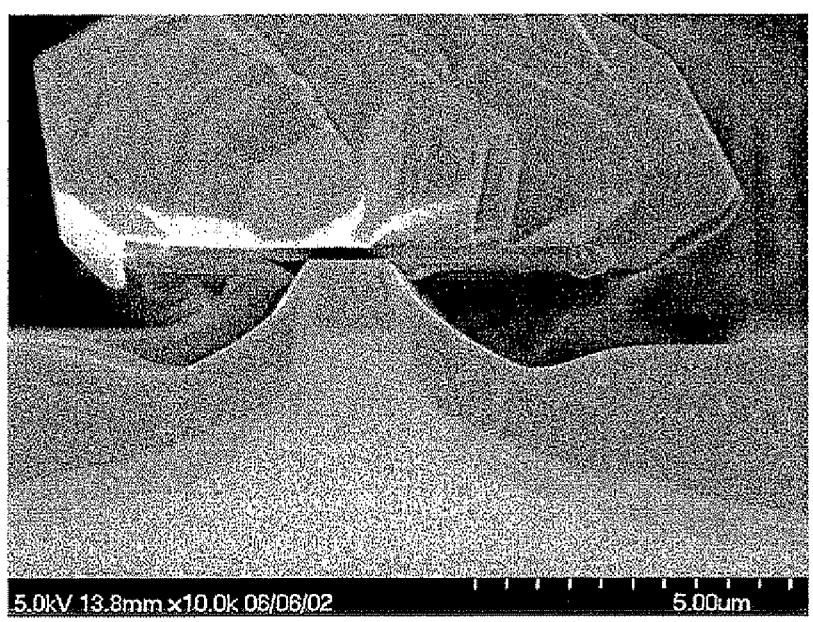
FIG. 9 is a cross-sectional SEM image after performing mesa burying growth when ashing treatment has not been performed using $SF_6$ gas.

FIG. 8 is a cross-sectional SEM (scanning electron microscope) image after performing mesa burying growth when ashing treatment has been performed using SF₆ gas; and FIG. 9 is a cross-sectional SEM image after performing mesa burying growth when ashing treatment has not been performed using SF₆ gas. It is known from these images that the group III-V compound semiconductor film 17 is not grown on the SiO₂ film 15 whose surface has been terminated with fluorine. 1S According to the first embodiment, by selectively burying the mesa structure 16 with a group III-V compound semiconductor film 17 using the SiO₂ film 15 whose surface has been terminated with fluorine as a mask, favorable burying growth can be achieved without growing the group III-V compound semiconductor film 17 on the SiO₂ film 15 used as the mask.

In the first embodiment, although the semiconductor film 11 is subjected to wet etching to form the mesa structure 16, the semiconductor film 11 may be subjected to dry etching to form the mesa structure 16. Although the surface of the SiO₂ film 15 is terminated with fluorine after forming the mesa structure 16, this treatment may be carried out before forming the mesa structure 16. Furthermore, in the first embodiment, although MOVPE is used for the crystal growth of the group III-V compound semiconductor film 17, other epitaxial growth methods may also be used.

In the step for terminating the surface of the SiO₂ film 15 with fluorine, the surface of the SiO₂ film 15 treated by ashing using SF₆ gas (sulfur hexafluoride) in the first embodiment, other fluorine-containing gases, such as CF₄ (carbon tetradluoride) and CHF₃ (trifluoro methane), may also be used. Alternatively, the surface of the SiO₂ film 15 may be treated using a fluorine-containing solution, such as buffered hydrofluoric acid and a diluted hydrogen fluoride acid.

As the group III-V compound semiconductor film 17, a laminated structure containing an aluminum-containing semiconductor material, such as $Al_xGa_yIn_{1-x-y}As$ (0<x<1, 0≦y<1, 0<x+y<1), $Al_xGa_yIn_{1-x-y}P$ (0<x<1, 0≦y<1, 0<x+y<1), $Al_xGa_{1-x}As$ (0<x≦1), and $Al_xGa_{1-x}N$ (0<x≦1), in a part or all of the structure is formed. In the first embodiment, although an SiO₂ film 15 is used as the insulating film, other insulating films, such as an SiN film, may also be used.

Although the manufacture of a semiconductor laser element has bees described for the first embodiment, the present invention is not limited thereto, but can be applied to the manufacture of any semiconductor elements, such as modulators, diodes, transistors, and light-sensitive elements.

In the first embodiment, although a GaAs substrate is used as the semiconductor substrate, an InP substrate or a GaN substrate may also be used. However, it is required to select an Al-containing material having a lattice constant matched with the lattice constant of the semiconductor substrate. Therefore, as the Al-containing semiconductor material for the group III-V compound semiconductor film 17, AlGaInP or AlGaAs is used in the case of an GaAs substrate; AlGaInAs or AlInAs is used in the case of a InP substrate; and AlGaN is used in the case of a GaN substrate.

Second Embodiment

Figure 10:
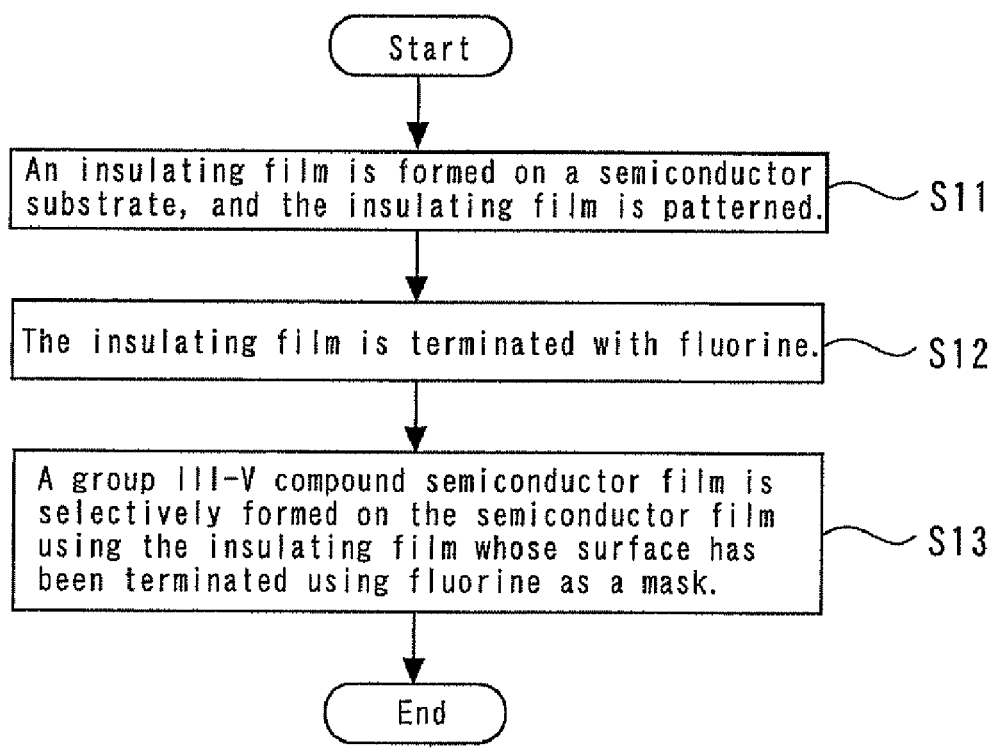
FIG. 10 is a flow chart for explaining a method of manufacturing a semiconductor device according to Second Embodiment of the present invention.

A method for manufacturing a selectively grown semiconductor laser element (semiconductor device) according to the second embodiment of the present invention will be described referring to a flow chart shown in FIG. 10.

Figure 11:
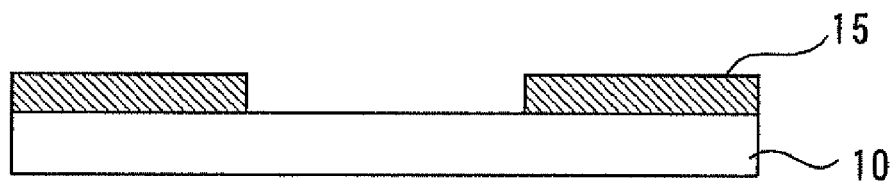
FIGS. 11-13 are sectional views for explaining a method of manufacturing a semiconductor device according to Second Embodiment of the present invention.

First, as shown in FIG. 11, an SiO₂ film 15 (insulating film) is formed on a p-type GaAs substrate 10, and the SiO₂ film 15 is patterned using a photoengraving process (Step S11).

Figure 12:
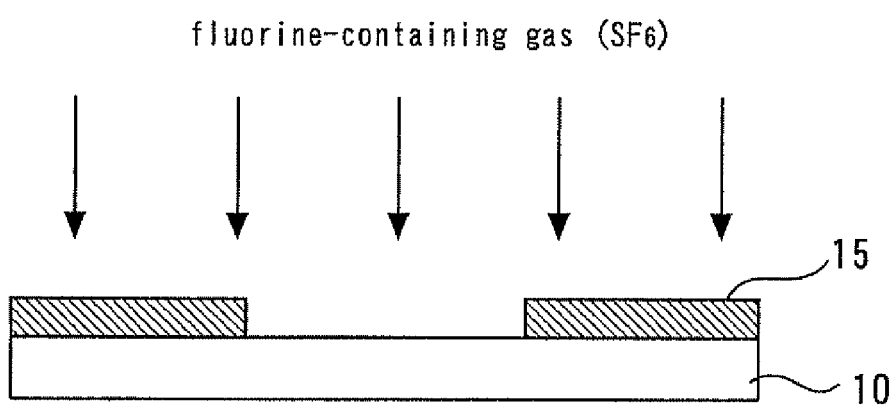

Next, as shown in FIG. 12, the surface of the SiO₂ film 15 is treated by ashing using SF₆ gas (fluorine-containing gas) to terminate the surface of the SiO₂ film 15 with fluorine (step S12).

Figure 13:
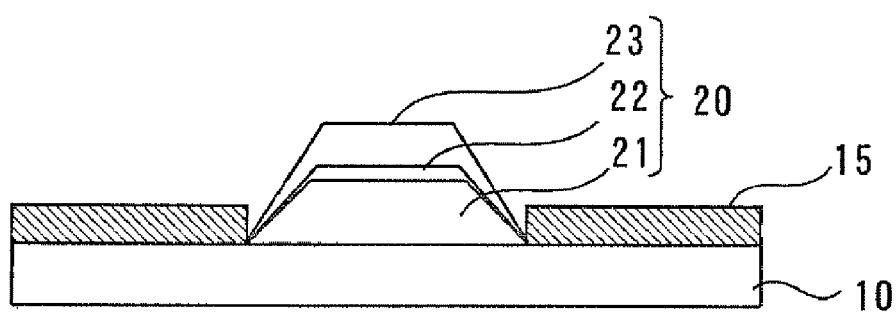

Next, as shown in FIG. 13, using the SiO₂ film 15 whose surface has been terminated with fluorine as a mask, a p-type lower clad layer 21, an undoped MQW active layer 22, and an n-type upper clad layer 23 are selectively formed using MOVPE on the GaAs substrate 10 as a group III-V compound semiconductor film 20 (Step S13). Thereafter, through other generally-used process steps, a semiconductor laser element can be manufactured.

According to the second embodiment, by selectively forming the group III-V compound semiconductor film 20 on the GaAs substrate 10 using the SiO₂ film 15 whose surface has been terminated with fluorine as a mask, favorable selection growth can be achieved without growing the group III-V compound semiconductor film 20 on the SiO₂ film 15 used as the mask.

In the second embodiment, although MOVPE is used for the crystal growth of the group III-V compound semiconductor film 20, other epitaxial growth methods may also be used.

In the step for terminating the surface of the SiO₂ film 15 with fluorine, the surface of the SiO₂ film 15 treated by ashing using SF₆ gas (sulfur hexafluoride) in the second embodiment, other fluorine-containing gases, such as CF₄ (carbon tetradluoride) and CHF₃ (trifluoro methane), may also be used. Alternatively, the surface of the SiO₂ film 15 may be treated using a fluorine-containing solution, such as buffered hydrofluoric acid and a diluted hydrogen fluoride acid.

As the group III-V compound semiconductor film 20, a laminated structure containing an aluminum-containing semiconductor material, such as $Al_xGa_yIn_{1-x-y}As$ (0<x<1, 0≦y<1, 0<x+y<1), $Al_xGa_yIn_{1-x-y}P$ (0<x<1, 0≦y<1, 0<x+y<1), $Al_xGa_{1-x}As$ (0<x≦1), and $Al_xGa_{1-x}N$ (0<x≦1), in a part or all of the structure is formed. In the second embodiment, although an SiO₂ film 15 is used as the insulating film, other insulating films, such as an SiN film, may also be used.

Although the manufacture of a semiconductor laser element has bees described for the second embodiment, the present invention is not limited thereto, but can be applied to the manufacture of any semiconductor elements, such as modulators, diodes, transistors, and light-sensitive elements.

In the second embodiment, although a GaAs substrate is used as the semiconductor substrate, an InP substrate or a GaN substrate may also be used. However, it is required to select an Al-containing semiconductor material for the group III-V compound semiconductor film 20 having a lattice constant matched with the lattice constant of the semiconductor substrate. Therefore, as the Al-containing semiconductor material for the group III-V compound semiconductor film 20, AlGaInP or AlGaAs is used in the case of an GaAs substrate; AlGaInAs or AlInAs is used in the case of an InP substrate; and AlGaN is used in the case of a GaN substrate.

Third Embodiment

A method for manufacturing a selectively grown semiconductor laser element (semiconductor device) according to the third embodiment of the present invention will be described.

Figure 14:
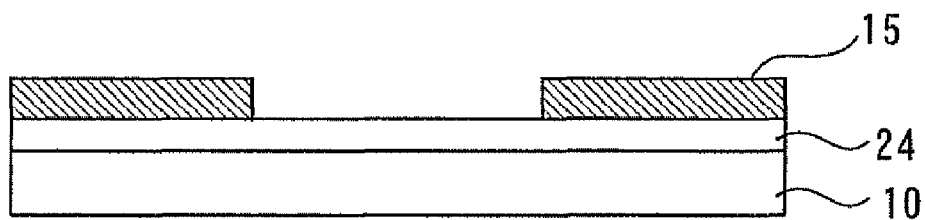
FIGS. 14-16 are sectional views for explaining a method of manufacturing a semiconductor device according to Third Embodiment of the present invention.

First, as shown in FIG. 14, a semiconductor film 24 is formed on a p-type GaAs substrate 10. Then, an $SiO_2$ film 15 (insulating film) is formed on the semiconductor film 24, and the $SiO_2$ film 15 is patterned using a photoengraving process.

Figure 15:
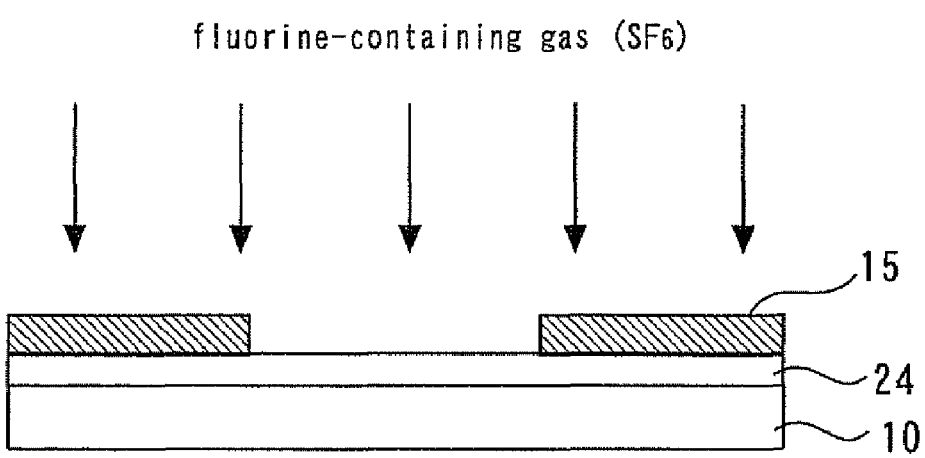

Next, as shown in FIG. 15, the surface of the $SiO_2$ film 15 is treated by ashing using $SF_6$ gas (fluorine-containing gas) to terminate the surface of the $SiO_2$ film 15 with fluorine (step S12).

Figure 16:
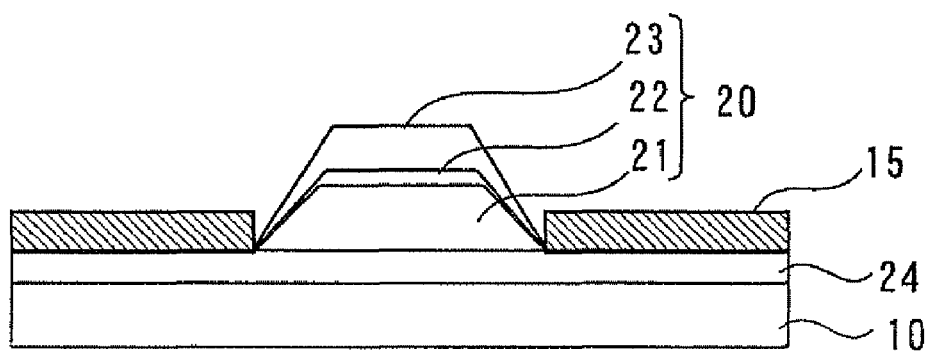

Next, as shown in FIG. 16, using the $SiO_2$ film 15 whose surface has been terminated with fluorine as a mask, a p-type lower clad layer 21, an undoped MQW active layer 22, and an n-type upper clad layer 23 are selectively formed on the semiconductor film 24 as a group III-V compound semiconductor film 20 using MOVPE. Thereafter, through other generally-used process steps, a semiconductor laser element can be manufactured.

The third embodiment is the same as the second embodiment except that the semiconductor film 24 is formed between the GaAa substrate 10 and the group III-V compound semiconductor film 20. Thereby, the equivalent effect as in the second embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-253303, filed on Sep. 28, 2006 including specification, claims, drawings and summary, on which the Convention priority of the present application is based, are incorporated herein by reference in its entirety.

What is claimed is:

1. A method for manufacturing a semiconductor device comprising:
    forming a semiconductor film on a semiconductor substrate;
    forming an insulating film on said semiconductor film and patterning said insulating film;
    terminating the surface of said insulating film using fluorine; and
    selectively forming a III-V compound semiconductor film on said semiconductor film using said insulating film, having the surface which has been terminated using fluorine, as a mask.

2. The method for manufacturing a semiconductor device according to claim 1, comprising:
    before terminating the surface of said insulating film using fluorine, etching said semiconductor film, using said insulating film as a mask, to form a mesa structure; and
    after terminating the surface of said insulating film using fluorine, in selectively forming said III-V compound semiconductor film, burying said mesa structure in said III-V compound semiconductor film using said insulating film, having the surface which has been terminated using fluorine, as a mask.

3. The method for manufacturing a semiconductor device according to claim 2, including wet etching or dry etching said semiconductor film in forming said mesa structure.

4. The method for manufacturing a semiconductor device according to claim 2, including terminating the surface of said insulating film by treating said insulating film in a fluorine-containing gas.

5. The method for manufacturing a semiconductor device according to claim 4, including treating the surface in a fluorine-containing gas selected from the group consisting of sulfur hexafluoride, carbon tetrafluoride, and trifluoromethane.

6. The method for manufacturing a semiconductor device according to claim 2, including terminating the surface of said insulating film by treating in a fluorine-containing solution.

7. The method for manufacturing a semiconductor device according to claim 6, including treating the surface in a hydrofluoric acid or buffered hydrofluoric acid solution.

8. The method for manufacturing a semiconductor device according to claim 2, wherein said III-V compound semiconductor film is an Al-containing semiconductor material.

9. The method for manufacturing a semiconductor device according to claim 8, wherein said III-V compound semiconductor film is selected from the group consisting of $Al_xGa_yIn_{1-x-y}As$ ($0<x<1$, $0\leq y<1$, $0<x+y<1$), $Al_xGa_yIn_{1-x-y}P$ ($0<x<1$, $0\leq y<1$, $0<x+y<1$), $Al_xGa_{1-x}As$ ($0<x\leq 1$), and $Al_xGa_{1-x}N$ ($0<x\leq 1$).

10. The method for manufacturing a semiconductor device according to claim 2, wherein said insulating film is $SiO_2$ or SiN.

11. A method for manufacturing a semiconductor device comprising:
    forming an insulating film on a semiconductor substrate and patterning said insulating film;
    terminating the surface of said insulating film using fluorine; and
    selectively forming a III-V compound semiconductor film on said semiconductor substrate using said insulating film, having the surface which has been terminated using fluorine, as a mask.

* * * * *